(12) United States Patent
Sammon

(10) Patent No.: US 6,433,424 B1
(45) Date of Patent: Aug. 13, 2002

(54) SEMICONDUCTOR DEVICE PACKAGE AND LEAD FRAME WITH DIE OVERHANGING LEAD FRAME PAD

(75) Inventor: Tim Sammon, Helensburgh (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/002,252

(22) Filed: Oct. 26, 2001

Related U.S. Application Data
(60) Provisional application No. 60/255,470, filed on Dec. 14, 2000.

(51) Int. Cl.[7] .............................................. H01L 23/48
(52) U.S. Cl. ...................................................... 257/735
(58) Field of Search ................................ 257/666, 783, 257/787, 672; 438/123; 361/813

(56) References Cited

U.S. PATENT DOCUMENTS

| | | | | |
|---|---|---|---|---|
| 5,072,280 A | * | 12/1991 | Matsukura .................... | 257/666 |
| 5,424,576 A | * | 6/1995 | Djennas et al. .............. | 257/666 |
| 5,438,021 A | * | 8/1995 | Tagawa et al. ............... | 438/123 |
| 5,521,429 A | * | 5/1996 | Aono et al. ................... | 257/676 |
| 5,683,944 A | * | 11/1997 | Joiner et al. ................. | 438/123 |
| 5,814,884 A | * | 9/1998 | Davis et al. .................. | 257/685 |
| 5,821,628 A | * | 10/1998 | Hotta ............................ | 257/783 |
| 5,905,301 A | * | 5/1999 | Ichikawa et al. ............ | 257/676 |
| 5,965,947 A | | 10/1999 | Nam et al. .................... | 257/783 |
| 6,157,074 A | | 12/2000 | Lee ............................... | 257/666 |
| 6,204,090 B1 | | 3/2001 | Boyle et al. ................... | 438/108 |
| 6,229,205 B1 | | 5/2001 | Jeong et al. .................. | 257/676 |
| 6,291,273 B1 | * | 9/2001 | Miyaki et al. ................ | 438/123 |
| 6,383,842 B1 | * | 5/2002 | Takashima et al. .......... | 438/115 |

FOREIGN PATENT DOCUMENTS

JP     4-69981    *   3/1992  ................. 257/100

OTHER PUBLICATIONS

International Search Report dated Apr. 4, 2002 from the International Searching Authority for corresponding PCT Appln. No. PCT/US01/46676.

* cited by examiner

*Primary Examiner*—Jasmine J B Clark
(74) *Attorney, Agent, or Firm*—Ostrolenk, Faber, Gerb & Soffen, LLP

(57) ABSTRACT

Semiconductor die are soldered or epoxy bonded to lead frame pads and overhang the pads to reduce thermal differential expansion and contraction stresses applied to the die from the lead frame pad. A plastic housing of standard size is unchanged in dimension, but contains a greater total silicon die area.

17 Claims, 3 Drawing Sheets

SEMICONDUCTOR DEVICE PACKAGE AND LEAD FRAME WITH DIE OVERHANGING LEAD FRAME PAD

RELATED APPLICATION

This application claims the benefit of U.S. Provisional Application No. 60/255,470, filed Dec. 14, 2000.

FIELD OF THE INVENTION

This invention relates to semiconductor device packages and more specifically relates to a novel package in which mechanical stresses on the semiconductor die are reduced.

BACKGROUND OF THE INVENTION

Semiconductor devices are well know, in which a thin brittle silicon die is secured to a lead frame by soldering or through the use of a conductive or non-conductive adhesive such as an epoxy. The lead frame, which is conventionally a conductive metal such as a thin flat plated copper alloy strip will have a large number of identical patterns stamped in the strip. The patterns provide enlarged pad areas to which a respective die can be secured, and a plurality of integral terminal sections or leads, or "pins", subsequently isolated from the pad, which receive wire bonds from leads to electrodes on the top surfaces of the die. After wire bonding, the individual lead frame device sections are over-molded with a suitable plastic housing. The individual packages are next separated and the various terminals are isolated from one another with the leads or pins from the terminal sections and pad connectors extending through the housing wall to permit electrical connection to the die housed within the package.

The pad receiving the silicon die in the past is always of larger area than the die, so that the full bottom surface of the die is rigidly connected to the pad surface. Since the silicon die and metal or other pad substrate have different coefficients of thermal expansion, the die, during soldering or other heat producing attachment processes, and during thermal cycling while in test or in operation, causes mechanical stress over the full surface area of the die. These stresses can cause damage to or breakage of the die.

BRIEF DESCRIPTION OF THE INVENTION

In accordance with the invention, the silicon die is dimensioned such that the die is larger than the die receiving pad, in at least one and preferably in all directions. Consequently, a smaller portion of the area of the die is connected rigidly to the pad, and the total stress applied to the die is reduced.

In a preferred embodiment, at least two small area but overhanging die are used with two even smaller respective area pads. Thus, the two die will have the same total area as a single die which may have been previously used, and both have a reduced pad area contact. Consequently, stress on the two (or more) die is substantially reduced.

In a preferred embodiment of the invention, two overhanging MOSFET die may be employed for a 6 lead TSOT type package. The die can be interconnected as desired (in parallel or series arrangement). Other device die combinations, for example, a MOSFET die and a Schottky diode die could also be placed in a common package, both overhanging their respective lead frame pads.

A significant advantage of the invention is that it permits the housing of significantly larger silicon die area in a standard outline plastic package without increasing the outline dimensions.

DETAILED DESCRIPTION OF THE DRAWINGS

Figure 1:
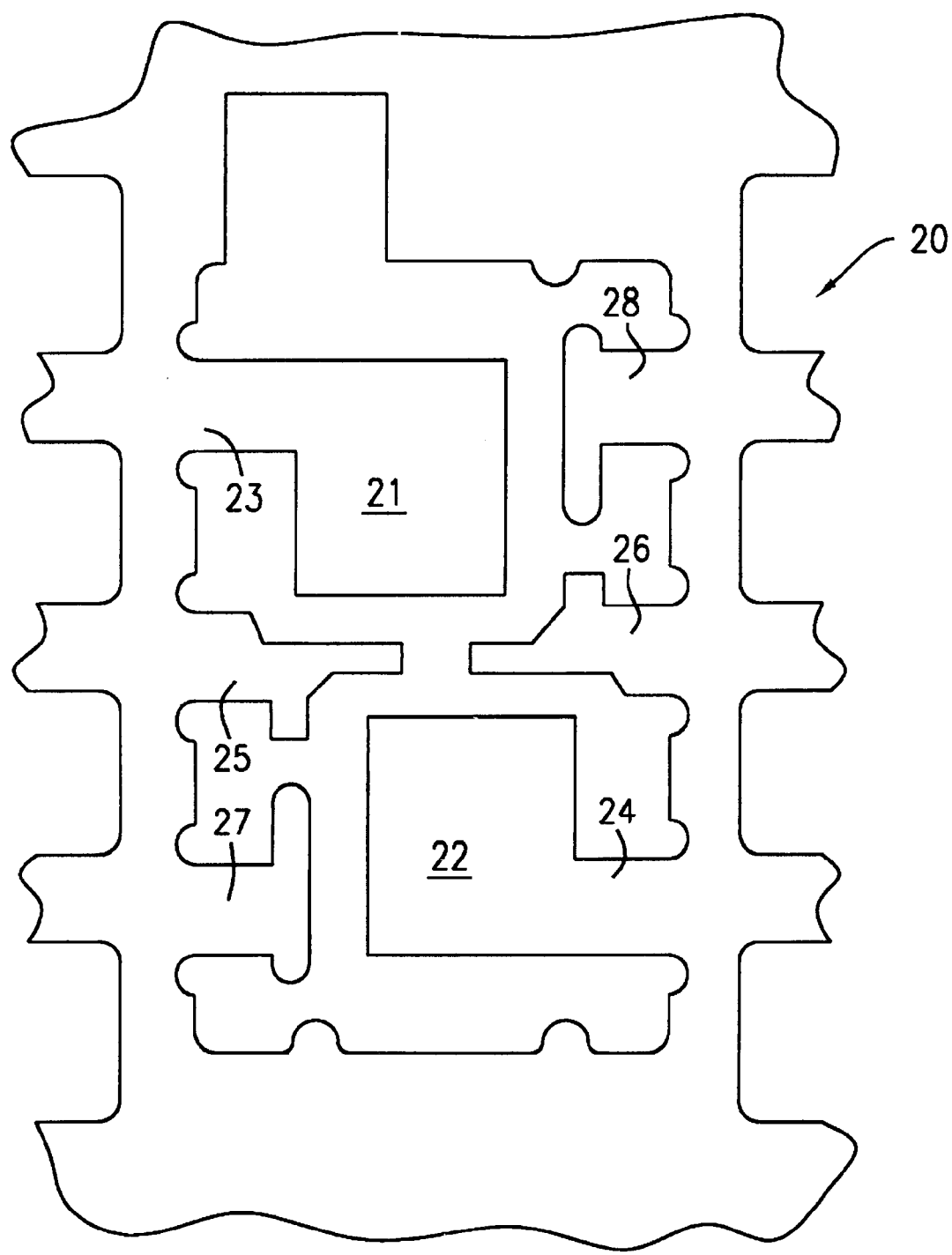
FIG. 1 shows a small portion of a lead frame which can be used with the present invention.

Referring first to FIG. 1, there is shown a small portion of a large conventional lead frame 20 which is stamped to provide a plurality of identical patterns, one of which is shown in FIG. 1. The pattern includes two die-receiving, pads 21 and 22 which have integral extending pins 23 and 24 respectively. The lead frame further contains gate lead pins 25 and 26 (for the gates of respective MOSFETs) and source pins 27 and 28 (for the source electrodes of respective MOSFETs on pads 21 and 22).

It should be noted that while two pads are shown for a single package, any desired number of pads can be used, and indeed, one die can share more than one of the pads. Further die other than MOSFET die could be used, with suitable changes in the lead frame pin out.

Figure 2:
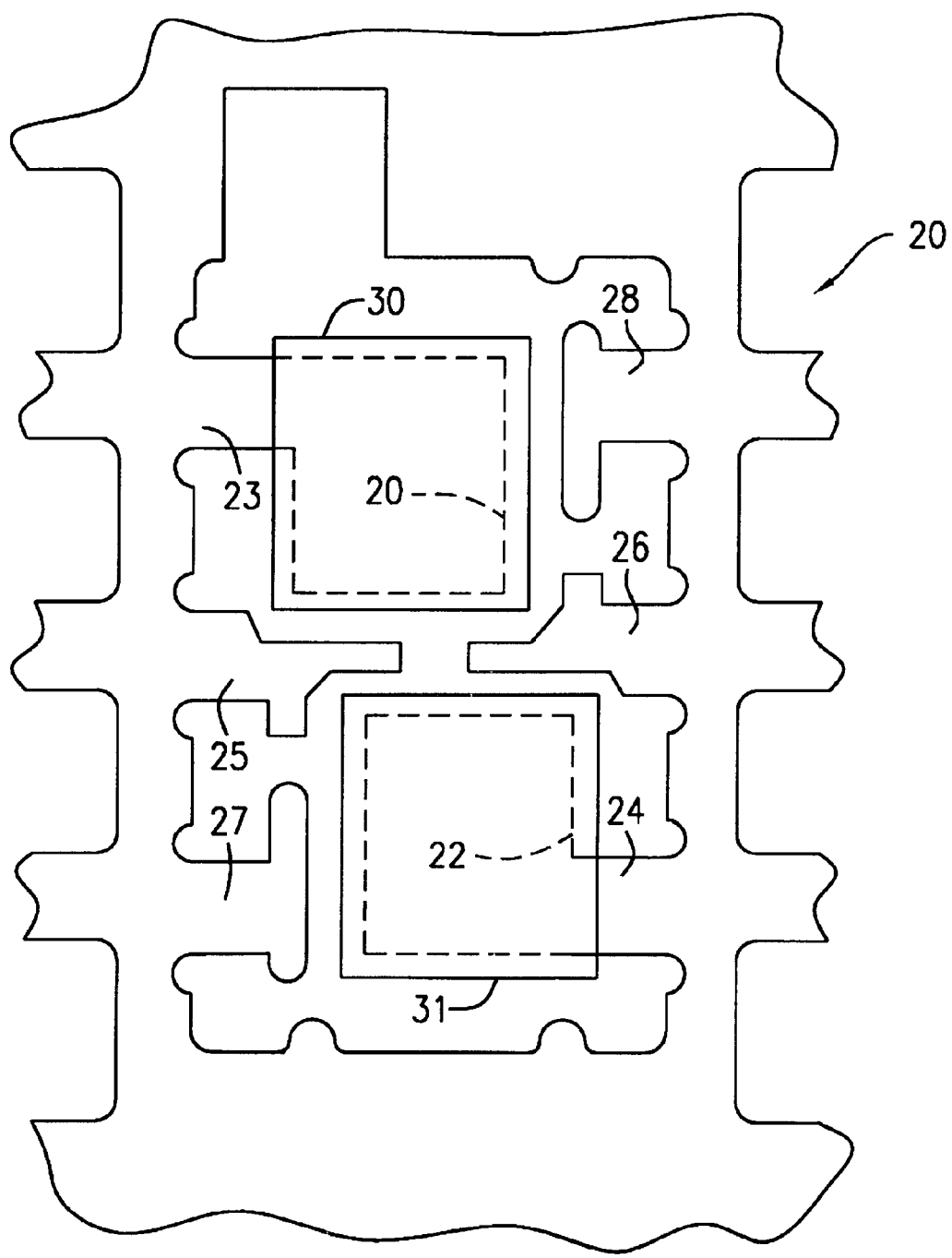
FIG. 2 shows the lead frame of FIG. 2 with two die in place, overlapping their respective lead frame pads.

As next shown in FIG. 2, two semiconductor die 30 and 31 are secured to pads 21 and 22 respectively. Die 30 and 31 are vertical conduction MOSFETs having a conventional bottom drain electrode and a source electrode and gate electrode on their upper surfaces. The electrode patterns are well known and are not shown. Any other semiconductor die could be used including diodes, IGBTs, thyristors, and bipolar transistors.

In accordance with the invention, the die 30 and 31 are larger in area than the pads 21 and 22 respectively and overhang the pads 21 and 22 around their fall peripheries. In one example of the invention, the die 30 and 31 may each have dimensions of 0.99 mm by 1.092 mm while the pads 21 and 22 may each have dimensions of 0.79 mm by 0.89 mm respectively. While the two die are shown with equal sizes and the two pads are shown with equal sizes, it should be noted that the pads 21 and 22 can have different dimensions from one another, as can the die 30 and 31.

The bottom drain electrodes of die 30 and 31 are conventionally rigidly connected to the confronting areas of pads 21 and 22 respectively, as by soldering or by adhesive bonding.

Obviously, the die 30 and 31 overhang their respective pads 21 and 22, reducing the contact area, and thus the amount of stress transmitted to die 30 and 31 during differential thermal expansion and contraction of the silicon die and of the lead frame materials.

After the die 30 and 31 are secured to pads 21 and 22, the top electrodes of the die are conventionally wire-bonded to pins 25 and 28 and the top electrodes of die 31 are wire bonded to pins 26 and 27.

Note that more die area can now be contained withing the housing 50, without increasing its dimensions.

Figure 4:
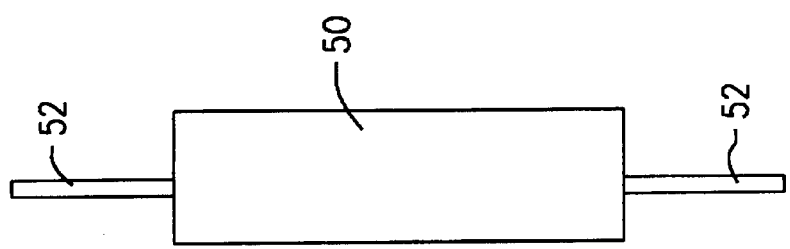
FIG. 4 is a side view of the package of FIG. 3.
Figure 3:
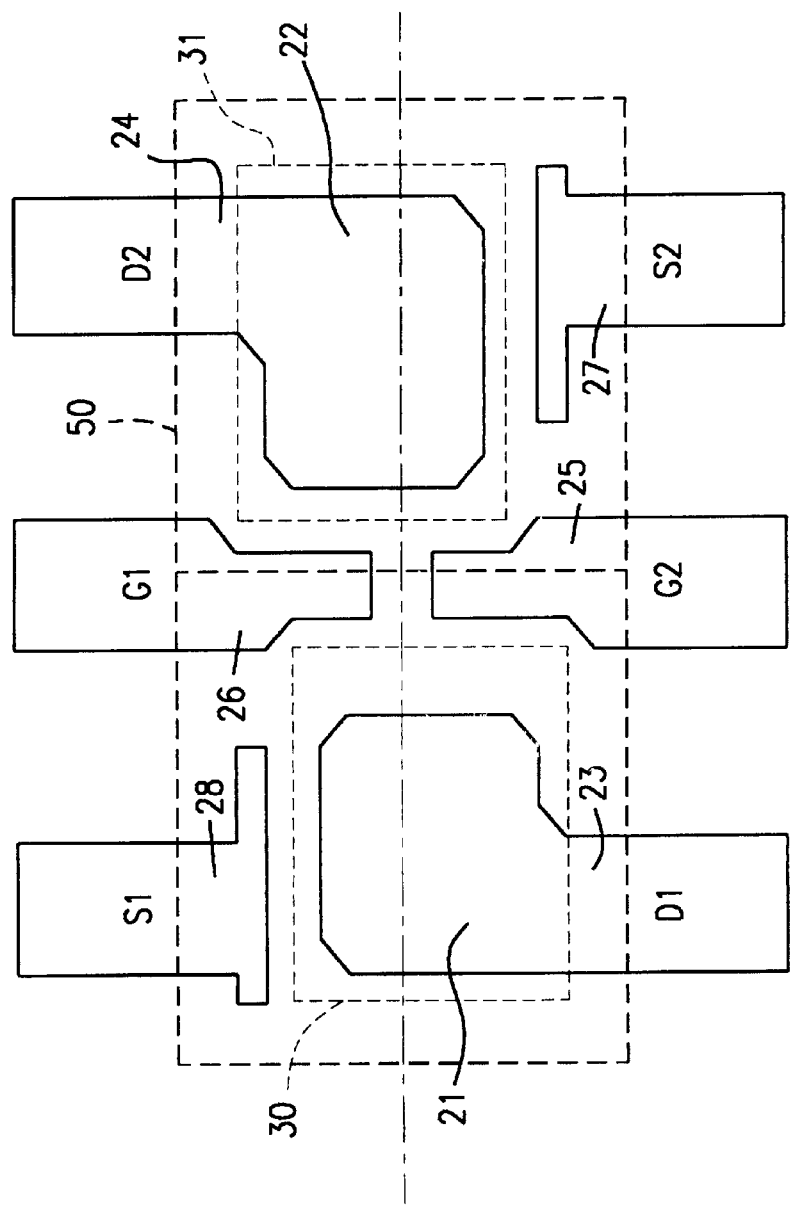
FIG. 3 is a top, schematic view of a single 6 pin package after overmolding with a plastic housing and after trimming of the package out of the lead frame.

The lead frame is then conventionally over-molded with a plastic housing 50, shown in FIG. 3 (in dotted lines) and in FIG. 4. The lead frame is then trimmed, removing the bridges between terminals or pins 23, 25 and 27 on one side and 24, 26 and 28 on the other side of the resulting package.

Pins 23 to 28 all extend through the side of the package, defining a 6 pin TSOT type device and correspond to pins $D_1$, $D_2$, $G_2$, $G_1$, $S_2$ and $S_1$, respectively for MOSFETs 30 and 31 as shown in FIGS. 3 and 4. All pins with a "1" subscript are pins for MOSFET 30 and these with subscript "2" are pins for MOSFET 31. Note that the various pins can be externally connected as desired, or can be internally connected to form various connections between the two die.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising a thin flat semiconductor die and a thin flat conductor member which is the primary support for supporting said semiconductor die; said die being disposed atop and bonded in surface to surface contact with the top surface of said conductive member; said die having at least one dimension which is greater than a corresponding dimension of said support member, whereby said die at least partially overhangs said support member in said dimension.

2. The device of claim 1, wherein said die overhangs the full top surface area of said support member.

3. The device of claim 1, wherein said die is bonded to said support member by solder.

4. The device of claim 1, wherein said die is bonded to said support member by an epoxy adhesive.

5. The device of claim 1, wherein said support member is a segment of a lead frame.

6. The device of claim 1, wherein said device is housed in a plastic package.

7. The device of claim 5, wherein said die overhangs the full top surface area of said support member.

8. The device of claim 6, wherein said die overhangs the full top surface area of said support member.

9. The device of claim 8, wherein said support member is a segment of a lead frame.

10. The device of claim 9, wherein said support member comprises a lead frame pad; said lead frame pad housing in integral lateral extension which extends through the wall of said package to be accessible for connection externally of said package.

11. A semiconductor device package comprising a flat conductive lead frame having at least one lead frame pad; at least one thin flat semiconductor device supported atop and intimately connected to said lead frame pad; and a plastic enclosure enclosing said lead frame pad and said die; said die overhanging said lead frame pad in at least one dimension, whereby the stress due to differential expansion and contraction of said pad and die is reduced.

12. The package of claim 11, wherein said die overhangs said pad in all dimensions.

13. The package of claim 11, wherein said die is a MOSFET.

14. The package of claim 11, wherein said lead frame pad has a laterally extending integral pin which extends through the wall of said enclosure.

15. The package of claim 11, which includes a second lead frame pad within said plastic enclosure and a second die secured thereon and at least a portion of said second die overhanging said second lead frame pad.

16. The package of claim 15, wherein said first and second die overhang said first and second pads respectively in all dimensions.

17. The package of claim 16, wherein said first and second die are each MOSFETs.

* * * * *